(12) United States Patent
Li et al.

(10) Patent No.: US 12,451,431 B2
(45) Date of Patent: Oct. 21, 2025

(54) STACKED SEMICONDUCTOR DEVICES WITH TOPSIDE AND BACKSIDE INTERCONNECT WIRING

(71) Applicant: International Business Machines Corporation, Armonk, NY (US)

(72) Inventors: Tao Li, Slingerlands, NY (US); Liqiao Qin, Albany, NY (US); Mukta Ghate Farooq, Hopewell Jct, NY (US); Ruilong Xie, Niskayuna, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 595 days.

(21) Appl. No.: 17/661,583

(22) Filed: May 2, 2022

(65) Prior Publication Data
US 2023/0352406 A1 Nov. 2, 2023

(51) Int. Cl.
*H01L 23/528* (2006.01)
*H01L 23/00* (2006.01)
(Continued)

(52) U.S. Cl.
CPC ........ *H01L 23/5286* (2013.01); *H01L 23/481* (2013.01); *H01L 24/33* (2013.01);
(Continued)

(58) Field of Classification Search
CPC . H01L 23/5286; H01L 23/528; H01L 23/481; H01L 24/33; H01L 25/0657;
(Continued)

(56) References Cited

U.S. PATENT DOCUMENTS 6,838,774 B2  1/2005  Patti
8,563,403 B1  10/2013  Farooq
(Continued)

OTHER PUBLICATIONS

A. Razavieh, P. Zeitzoff and E. J. Nowak, "Challenges and Limitations of CMOS Scaling for FinFET and Beyond Architectures," in IEEE Transactions on Nanotechnology, vol. 18, pp. 999-1004, 2019, doi: 10.1109/TNANO.2019.2942456. (Year: 2019).*

(Continued)

*Primary Examiner* — Douglas M Menz
(74) *Attorney, Agent, or Firm* — Edward J. Wixted, III

(57) ABSTRACT

An approach for forming semiconductor structure composed of one or more stacked semiconductor devices with a first semiconductor device on a substrate, a first interconnect wiring structure over the first semiconductor device, a second interconnect wiring structure under a second semiconductor device joined to the first interconnect wiring structure, and a third interconnect wiring structure on the second semiconductor device where the first semiconductor device and the second semiconductor device are each one of a memory device or a logic device. The approach includes each of the first interconnect wiring structure, the second interconnect wiring structure, and the third interconnect wiring structure with a contact pitch to the first semiconductor device and to both sides of the second semiconductor device that is less than one hundred nanometers.

15 Claims, 16 Drawing Sheets

(51) Int. Cl.
*H01L 23/48* (2006.01)
*H01L 25/065* (2023.01)

(52) U.S. Cl.
CPC .......... *H01L 24/48* (2013.01); *H01L 25/0657* (2013.01); *H01L 2224/04042* (2013.01); *H01L 2224/48227* (2013.01); *H01L 2224/73265* (2013.01); *H01L 2225/06541* (2013.01)

(58) Field of Classification Search
CPC . H01L 2224/73265; H01L 2225/06541; H01L 25/18; H01L 2224/08146; H01L 2224/80895; H01L 2225/06565; H01L 25/50
USPC .......................................................... 257/758
See application file for complete search history.

(56) References Cited

U.S. PATENT DOCUMENTS

| | | | |
|---|---|---|---|
| 8,853,799 | B2 | 10/2014 | O'Donnell |
| 9,543,229 | B2 | 1/2017 | Batra |
| 10,243,016 | B2 | 3/2019 | Kumar |
| 10,325,804 | B2 | 6/2019 | Hellmund |
| 10,403,659 | B2 | 9/2019 | Gambino |
| 10,636,739 | B2 | 4/2020 | Beyne |
| 10,777,598 | B2 | 9/2020 | Miyazawa |
| 11,081,559 | B1 | 8/2021 | Liang |
| 2010/0264551 | A1 | 10/2010 | Farooq |
| 2014/0175655 | A1 | 6/2014 | Chen |
| 2015/0371938 | A1 | 12/2015 | Katkar |
| 2018/0286846 | A1* | 10/2018 | Lin ........................ H01L 24/08 |
| 2020/0035560 | A1* | 1/2020 | Block ................ H10D 84/0186 |
| 2020/0058617 | A1* | 2/2020 | Wu .......................... H01L 24/83 |
| 2020/0152508 | A1 | 5/2020 | Jourdain |
| 2020/0266169 | A1 | 8/2020 | Kang |
| 2020/0303361 | A1* | 9/2020 | Shih .................... H01L 23/5283 |
| 2020/0365592 | A1* | 11/2020 | Yamazaki .......... G11C 16/0433 |
| 2021/0057332 | A1* | 2/2021 | Chen .................. H01L 21/6836 |
| 2021/0084249 | A1 | 3/2021 | Nakazawa |
| 2021/0134748 | A1* | 5/2021 | Liu ........................ H01L 25/50 |
| 2021/0351079 | A1 | 11/2021 | Su |
| 2021/0357565 | A1 | 11/2021 | Fang |
| 2023/0138813 | A1* | 5/2023 | Seo ..................... H01L 25/0657 257/774 |

OTHER PUBLICATIONS

Ranganathan et al., "Integration of High Aspect Ratio Tapered Silicon Via for Through-Silicon Interconnection", 2008 Electronic Components and Technology Conference, pp. 859-865, publisher: IEEE (Year: 2008).*

Veloso et al., "Enabling logic with backside connectivity via n-TSVs and its potential as a scaling booster," Symposium on VLSI Technology. IEEE, 2021, TSF2-6, 2 pages.

* cited by examiner

STACKED SEMICONDUCTOR DEVICES WITH TOPSIDE AND BACKSIDE INTERCONNECT WIRING

BACKGROUND OF THE INVENTION

The present invention relates generally to the field of semiconductor device technology and more particularly to stacking semiconductor devices with backside and topside interconnect wiring The semiconductor industry is facing a new era in which device scaling and cost reduction may not continue following Moore's Law by shrinking feature size and packing more circuits into semiconductor chips. Packing more transistors on a semiconductor chip is becoming more difficult and expensive. Integrating more functions into a single chip, known as a system on a chip (SoC), presents many challenges that include higher costs and design complexities. The traditional IC design trend to pack more transistors on a monolithic die or SoC at each process node, results in difficult chip scaling for the integration of analog, logic, and memory circuits.

Emerging as an alternative to traditional SoC is heterogeneous integration. Heterogeneous integration is the integration of separately manufactured components or devices into a higher-level assembly that can provide enhanced functionality and improved operating characteristics. The heterogeneous integration approach includes die-partitioning or chiplets, which offers a compelling value proposition for yield improvement, intellectual property reuse, and performance.

Heterogeneous integration can use advanced packaging technologies to integrate individual devices which could be designed separately to be designed together in a single element or chip that can provide improved performance. The combined components can vary in functionality (e.g., specialized processors, dynamic random-access memory, flash memory, surface mount device (SMD), resistor/capacitor/inductor, filters, etc.). The overall idea behind heterogeneous integration is to integrate multiple semiconductor devices in the same chip or package.

SUMMARY

Embodiments of the present invention provide a semiconductor structure composed of stacked semiconductor devices with a first semiconductor device on a substrate, a first interconnect wiring structure over the first semiconductor device, a second interconnect wiring structure under a second semiconductor device that is joined to the first wiring interconnect structure, and a third wiring interconnect structure on the second semiconductor device where the first semiconductor device and the second semiconductor device are each one of a memory device or a logic device. Embodiments of the present invention provide each of the first interconnect wiring structure, the second interconnect wiring structure, and the third interconnect wiring structure with a contact pitch to the first semiconductor device and to both sides of the second semiconductor device that is less than one hundred nanometers.

Embodiments of the present invention provide a semiconductor structure composed of stacked semiconductor devices and a method of forming the semiconductor structure that includes a first semiconductor device on a semiconductor substrate and a first interconnect wiring structure over the first semiconductor device. The semiconductor structure includes a second interconnect wiring structure under a second semiconductor device that is joined to the first wiring interconnect structure and a third interconnect wiring structure on the second semiconductor device joined to a fourth interconnect wiring structure under a third semiconductor device. The semiconductor structure includes a fifth interconnect wiring structure on the third semiconductor device. Embodiments of the present invention provide at least one first through-silicon via from a bottom surface of the first substrate to a top surface of the first interconnect wiring structure connecting to a second through-silicon via. Additionally, the semiconductor structure includes the second through-silicon via connecting to the first at least one through-silicon via and to a top surface of the third interconnect wiring structure and at least one third through-silicon via connecting a top surface of the third interconnect wiring structure with a top surface of the fifth interconnect wiring structure.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
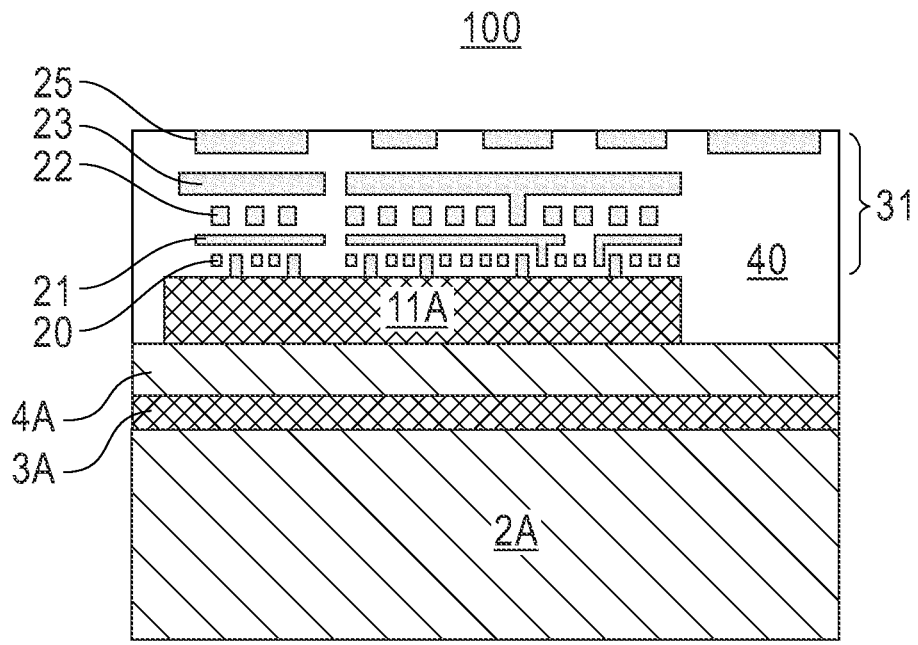
FIG. 1 is a cross-sectional view of a semiconductor structure after forming an interconnect wiring structure over a first semiconductor device in accordance with an embodiment of the present invention.

Embodiments of the present invention recognize that traditional IC design trends to pack more transistors on a monolithic die or system-on-chip (SoC) at each process node, results in difficult chip scaling for the integration of analog, logic, and memory circuits. To provide an effective alternative to this approach, heterogeneous integration of separately manufactured components or semiconductor devices into a higher-level assembly can provide enhanced functionality and improved operating characteristics.

Embodiments of the present invention disclose stacked semiconductor devices where one or more semiconductor devices are stacked above a first semiconductor device on a first semiconductor substrate. Each of the semiconductor devices can be formed using known device formation processes on its own substrate or semiconductor wafer with a conventional interconnect wiring structure or power distribution network above each individually formed semiconductor device. Each semiconductor device to be stacked on the first semiconductor device is composed of a semiconductor substrate with an etch stop layer such as a buried oxide layer covered by a thin layer of semiconductor material.

Embodiments of the present invention provide a semiconductor structure with one or more semiconductor devices that are stacked above a first semiconductor device on a first semiconductor substrate. Each of the semiconductor devices stacked above the first semiconductor device on the semiconductor substrate have an interconnect wiring structure above the semiconductor device and an interconnect wiring structure that is below each of the stacked semiconductor devices. The contact pitch at both sides of the device die can be less than 100 nm. Furthermore, in embodiments of the present invention, each of the stacked semiconductor devices are joined using the top surface of the interconnect wiring structure and thermal compression bonding to the bottom surface of the interconnect wiring structure of the semiconductor device stacked on it.

Embodiments of the present invention disclose a method of forming stacked semiconductor devices on the first semiconductor device on a first semiconductor substrate. The method includes using known semiconductor device processes to form semiconductor devices which may be a logic device, a memory device, or another type of semiconductor device that are each on a separate semiconductor substrate. The semiconductor substrate for each of the semiconductor devices to be stacked can be silicon-on-insulator substrate with a buried oxide layer and a thin layer of semiconductor material over the buried oxide. The method includes bonding the interconnect wiring structure of the first semiconductor device to a wiring structure of another semiconductor device to be stacked on the first semiconductor device. The first semiconductor substrate can have TSVs formed from bottom surface of the first wafer substrate to the top surface of the wiring interconnect structure on the first.

The method includes flipping the bonded semiconductor structure to expose the wafer substrate of the stacked semiconductor device on the first semiconductor device and using backside wafer thinning processes to remove the wafer substrate above the stacked semiconductor device followed by one or more etching processes to remove the tch stop layer such as a buried oxide layer and the thin layer of semiconductor material.

The method includes forming one or more of the interconnect wiring structures with a contact pitch of less than one hundred nanometers with the device that the wiring structure resides on. The method includes using wafer backside power delivery network (BSPND) processes to form a second interconnect wiring structure on the exposed back surface of the stacked semiconductor device where the bottom surface of the formed second interconnect wiring structure on the exposed back surface of the stacked device has a contact pitch of less than one hundred nanometers to the device on which the second interconnect wiring structure resides. The formed second wiring structure can be bonded to the wiring structure of another semiconductor device that is stacked above the stacked semiconductor device. TSVs can be formed from the top of the second wiring structure to the top surface of the wiring structure over the first semiconductor device and furthermore, can be formed from the top surface of the wiring interconnect structure over the second stacked semiconductor structure to the top surface of the wiring structure over the first stacked semiconductor device. Using the method described herein, embodiments of the present invention are not limited to two semiconductor devices stacked above the first semiconductor device but can be used to form three or more stacked semiconductor devices.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for semiconductor chips, and only so many of the commonly practiced process steps are included as are necessary for an understanding of the described embodiments. The figures represent cross-section portions of the semiconductor chip with one or more vertically stacked semiconductor devices after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

Removing or etching as used herein may or may not include patterning using one of lithography, photolithography, an extreme ultraviolet (EUV) lithography process, or other known semiconductor patterning process that is followed by one or more of the etching processes. Various materials are referred to herein as being removed or "etched" where etching generally refers to one or more processes implementing the removal of one or more materials. In some cases, the removal of a material in an area occurs while leaving other protected areas of materials unaffected that are masked during the lithography processes. Some examples of etching processes include but are not limited to the following processes, such as a dry etching process using a reactive ion etch (RIE) or ion beam etch (IBE), a wet chemical etch process, or a combination of these etching processes. A dry etch may be performed using plasma. Plasma systems can operate in several modes by adjusting the parameters of the plasma. Ion milling, sputter etching, or reactive ion etching (RIE) bombards the wafer with energetic ions of noble gases that approach the wafer approximately from one direction, and therefore, these processes are anisotropic or a directional etching process. Chemical mechanical planarization (CMP) is another known process of removing material using a combination of abrasive (polishing using an abrasive substance) and chemical processes to remove material from a top surface of a substrate.

Deposition processes as used herein include but are not limited to chemical vapor deposition (CVD), plasma-enhanced chemical vapor deposition (PECVD), atomic layer deposition (ALD), ionized plasma vapor deposition (iPVD), plasma vapor deposition (PVD), gas cluster ion beam (GCIB) deposition, electroplating, but may not be limited these known semiconductor deposition processes.

The term epitaxy, as known to one skilled in the art, refers to a type of crystal growth or material deposition in which new crystalline layers are formed with one or more well-defined orientations with respect to the crystalline seed layer. The deposited crystalline film is called an epitaxial film or epitaxial layer. "Epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the growth surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Doping of epitaxially grown materials such as adding boron, phosphorous, or other materials can occur during epitaxial growth using known doping methods.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In various embodiments of the present invention, each of the semiconductor structures of FIG. 1, FIG. 2, FIG. 3, and FIG. 4 with devices 11A, 11B, 11C, and 11D, respectively, that are each formed on a different wafer substrate or a portion of a wafer substrate, such as substrate 2A, 2B, 2C, and 2D before stacking the semiconductor devices. The details of the various embodiments of the semiconductor structures and the methods of forming the various stacked semiconductor structures for the present invention will be discussed in detail below with reference to FIGS. 1-19.

FIG. 1 is a cross-sectional view of semiconductor structure 100 after forming interconnect wiring 31 over device 11A in accordance with an embodiment of the present invention. As depicted, FIG. 1 includes substrate 2A, etch stop 3A, semiconductor 4A, device 11A, metal layer 20, metal layer 21, metal layer 22, metal layer 23, metal layer 25, where metal layers 20, 21, 22, 23, and 25 compose interconnect wiring 31, and interlayer dielectric material (ILD) 40. In semiconductor structure 100 depicted in FIG. 1, device 11A can be any type of semiconductor device (e.g., a logic device, a memory device, or any other type of semiconductor device).

In various embodiments, substrate 2A is a semiconductor wafer or a portion of a semiconductor wafer and is not limited to a thinned semiconductor substrate. In various embodiments, substrate 2A is a silicon substrate. In other embodiments, substrate 2A is any type of semiconductor substrate. For example, substrate 2A may be composed of any semiconductor material including, for example, Si, SiGe, SiGeC, SiC, Ge, GaAs, InAs, InP, or other III-V compound semiconductor materials, or HgTe, CdTe, HgCdTe, or other II-VI compound semiconductor materials. Substrate 2A can be a wafer or a portion of a wafer. Substrate 2A may be doped, undoped, or contain doped or undoped regions or, may be a layered semiconductor substrate. Substrate 2A may be strained, unstrained or a combination thereof. As depicted in FIG. 1, substrate 2A under device 11A is a portion of a semiconductor-on-insulator (SOI) substrate composed of substrate 2A, etch stop 3A (e.g., a buried oxide or BOX), and semiconductor 4A. In another example, substrate 2A is a silicon substrate with etch stop 3A (e.g., silicon germanium, etc.) that is a thin layer of silicon that can be epitaxially grown for semiconductor 4A.

In various embodiments, etch stop 3A is a layer of an etch stop material. For example, etch stop 3A can be a layer of a buried oxide (BOX) in an SOI wafer, a layer of silicon germanium (SiGe), or any other material used as an etch stop in semiconductor device formation.

In various embodiments, semiconductor 4A is a very thin layer of silicon. Semiconductor 4A can be a top portion of a SOI substrate composed of substrate 2A, etch stop 3A (e.g., BOX), and semiconductor 4A. For example, the buried oxide for etch stop 3A may be implanted into substrate 2A forming etch stop 3A with a thin layer of the semiconductor material of substrate 2A over etch stop 3A. In other embodiments, semiconductor 4A is a very thin layer of epitaxy (e.g., silicon). In some cases, semiconductor 4A may be epitaxially grown on etch stop 3, for example, when etch stop 3 is composed of SiGe. In some embodiments, semiconductor 4A is composed of another semiconductor material. A thickness of semiconductor 4A may range from 40 nm to 100 nm but is not limited to this range of thicknesses. In some embodiments, the combination of substrate 2A, etch stop 3A, and semiconductor 4A form a silicon-on-insulator substrate (SOI).

Device 11A can be any type of semiconductor device. For example, device 11A can be a logic device such as a field-effect transistor (FET), a finFET, etc. or a memory device such as a dynamic random-access memory (DRAM) device, a phase-change RAM (PCRAM), a magnetoresistive RAM (MRAM), a passive device, but is not limited to these types of semiconductor devices. Device 11A can be formed with known semiconductor device formation processes.

In various embodiments, metal layer 20, metal layer 21, metal layer 22, metal layer 23, and metal layer 25 form interconnect wiring 31. As depicted, metal layer 20 may be the M0 metal layer on device 11A, metal layer 21 may be the M1 metal layer, metal layer 22 may be the M2 metal layer, metal layer 23 may be the M3 metal layer, and metal layer 25 may be an Mx metal layer, where Mx may denote can be any number of metal layers. Interconnect wiring 31 may be composed any number of metal layers.

Interconnect wiring 31 can be formed during the backend of the line (BEOL) semiconductor device manufacture using known BEOL processes. In various embodiments, interconnect wiring 31 is formed using one or more of extreme-ultraviolet (EUV) lithography, deep ultraviolet (DUV) lithography, immersion lithography, or any other photolithography process. As known to one skilled in the art, EUV and DUV lithography utilize various wavelengths of light to obtain various feature sizes during BEOL wiring formation. Immersion lithography replaces the usual air gap between the final lens and the wafer surface with a liquid medium that has a refractive index greater than one. As depicted in FIG. 1, interconnect wiring 31 resides over device 11A and in ILD 40 above exposed portions of semiconductor 4A. As depicted in FIG. 1, interconnect wiring 31 is formed on the top side of device 11A. Interconnect wiring 31 includes metal layers 20, 21, 22, 23, and 25, each separated by one or more layers of a dielectric material (e.g., ILD 40) with conventional BEOL connections or vias (not labelled in FIG. 1). In some cases, interconnect wiring 31 may be known as a power delivery network (PDN). A PDN composed of interconnect wiring typically can be formed above or on a top surface of a device using known BEOL processes. For purposes of the current invention, interconnect wiring 31 may be also called a top side PDN.

Interlayer dielectric (ILD) 40 can be one or more layers of any known dielectric material (e.g., silicon dioxide, etc.) used to electrically isolate metal layers or conductive layers of a semiconductor structure. In some embodiments, one or more layers of ILD 40 are composed of a low-k dielectric material (e.g., SiOC). ILD 40 is deposited with known ILD deposition processes. As depicted in FIG. 1, ILD 40 surrounds exposed surfaces of metal layers 20, 21, 22, 23, and 25, device 11A, and is over exposed surfaces of semiconductor 4A.

Figure 2:
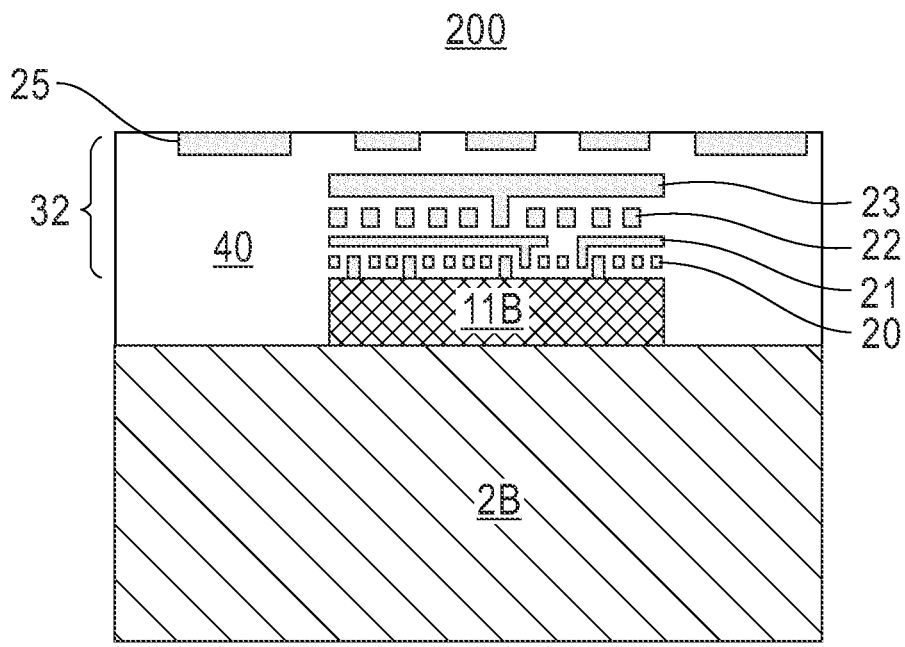
FIG. 2 is a cross-sectional view of a semiconductor structure after forming an interconnect wiring structure over a second semiconductor device in accordance with an embodiment of the present invention.

FIG. 2 is a cross-sectional view of semiconductor structure 200 after forming interconnect wiring 32 over device 11B in accordance with an embodiment of the present invention. As depicted, FIG. 2 includes substrate 2B, device 11B, metal layer 20, metal layer 21, metal layer 22, metal layer 23, metal layer 25, where metal layers 20, 21, 22, 23, and 25 compose interconnect wiring 32, and interlayer dielectric material (ILD) 40. Similar to devices 11A depicted in FIG. 1, device 11B can be any type of semiconductor device (e.g., a logic device, a memory device, etc.). In various embodiments, substrate 2B is a silicon wafer substrate or a portion of a silicon wafer substrate. In one embodiment, substrate 2B is a silicon-on-insulator substrate. In other embodiments, substrate 2B is composed of any semiconductor material.

Substrate 2B may be composed of the same or a similar semiconductor material as used to form device 11A in FIG. 1. As depicted in FIG. 2, substrate 2B is not a part of a SOI wafer. Device 11B and ILD 40 reside on substrate 2B in FIG. 2.

Interconnect wiring 32, as depicted, is composed of the BEOL interconnect wiring layers similar to interconnect wiring 31. As depicted, interconnect wiring 32 is composed of metal layers 20, 21, 22, 23, and 25 like interconnect wiring 31 that are separated by ILD 40. Similar to interconnect wiring 31, the number of metal layers are not limited to metal layer 20, 21, 22, 23, and 25. Any number of metal layers and number of connections between metal layers may be present in other embodiments of interconnect wiring 32.

Figure 3:
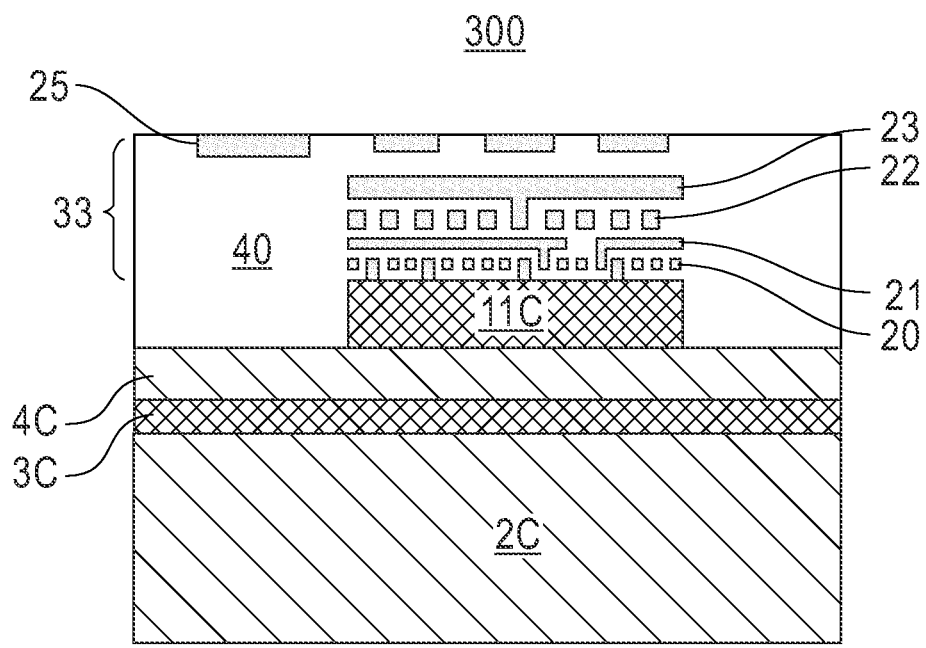
FIG. 3 is a cross-sectional view of a semiconductor structure after forming an interconnect wiring structure over a third semiconductor device in accordance with an embodiment of the present invention.

FIG. 3 is a cross-sectional view of semiconductor structure 300 after forming interconnect wiring 33 over device 11C in accordance with an embodiment of the present invention. As depicted, FIG. 3 includes substrate 2C, etch stop 3C, semiconductor 4C, device 11C, interconnect wiring 33, and ILD 40 where substrate 2C, etch stop 3C, and semiconductor 4C can be any of the materials discussed above with respect to FIG. 1 for substrate 2A, etch stop 3A, and semiconductor 4A. Similar to devices 11A and 11B depicted in FIGS. 1 and 2, respectively, device 11C can be any type of semiconductor device (e.g., a logic device, a memory device, etc.).

Interconnect wiring 33 can be formed during the backend of the line (BEOL) semiconductor device manufacture using known BEOL processes and may be composed of any number metal layers and connections (e.g., like metal layer 20, metal layer 21, metal layer 22, metal layer 23, and metal layer 25, but is not limited to this number of metal layers). As discussed above with reference to FIG. 1, interconnect wiring 33 can be formed using BEOL process which may include using one or more of EUV, DUV, or immersion lithography in order to form various wiring pitches. As depicted, interconnect wiring 33 extends over device 11C and over exposed portions of semiconductor 4C. In various embodiments, substrate 2C, etch stop 3C, and semiconductor 4C can be any of the same materials as substrate 2A discussed with respect to FIG. 1, etch stop 3C can be one of the same materials etch stop 3A, and substrate 2C can be any of the materials previously discussed with respect to substrate 2A.

Figure 4:
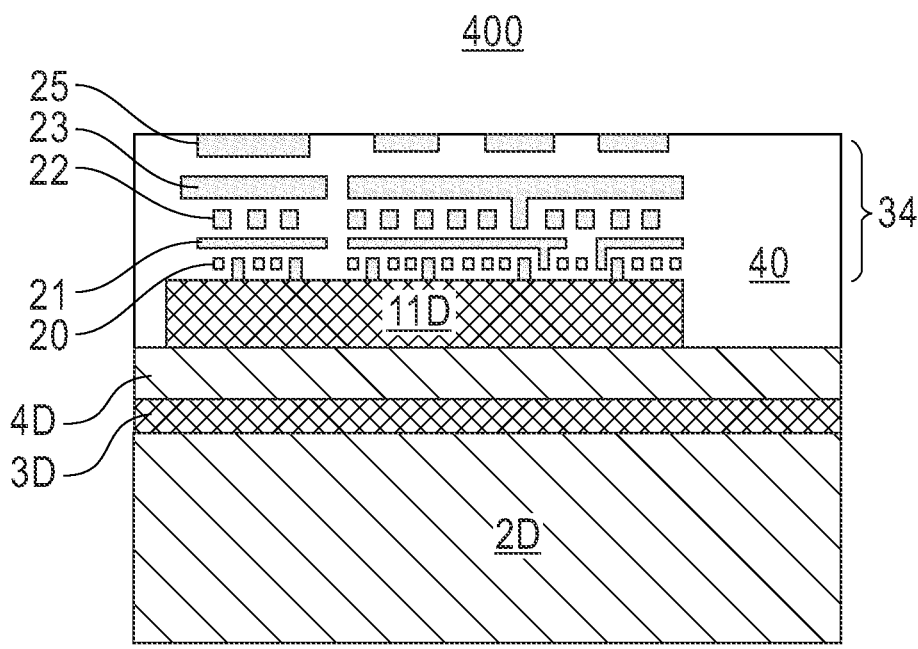
FIG. 4 is a cross-sectional view of a semiconductor structure after forming an interconnect wiring structure over a fourth semiconductor device in accordance with an embodiment of the present invention.

FIG. 4 is a cross-sectional view of semiconductor structure 400 after forming interconnect wiring 34 over device 11D in accordance with an embodiment of the present invention. As depicted, FIG. 4 includes substrate 2D, etch stop 3D, semiconductor 4D, device 11D, interconnect wiring 34, and ILD 40 where substrate 2D, etch stop 3D, and semiconductor 4D can be any of the materials discussed above with respect to FIG. 1 for substrate 2A, etch stop 3A, and semiconductor 4A. Similar to devices 11A depicted in FIG. 1, device 11D can be any type of semiconductor device (e.g., a logic device, a memory device, etc.). Interconnect wiring 34 can be formed during the backend of the line (BEOL) semiconductor device manufacture using known BEOL processes and may be composed of any number metal layers and connections. As depicted, interconnect wiring 34 extends over device 11D and in other examples can extend over exposed portions of semiconductor 4D.

Figure 5:
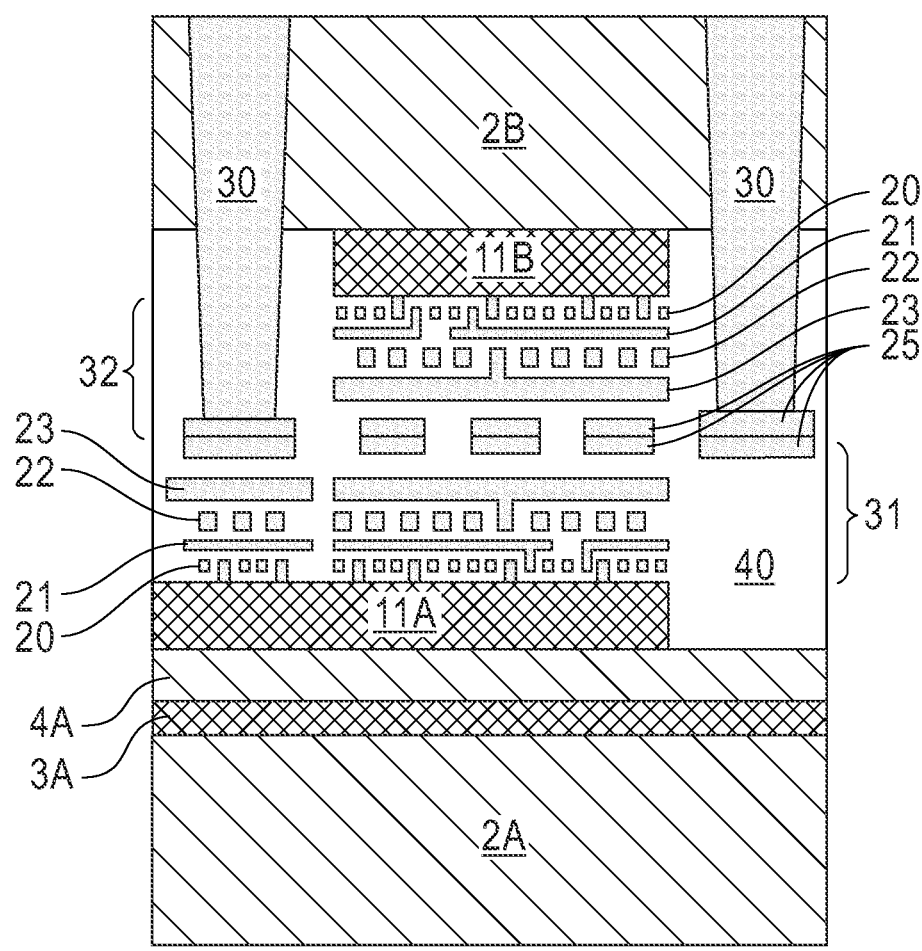
FIG. 5 is a cross-sectional view of a semiconductor structure after bonding the interconnect wiring structure of the first semiconductor device to the interconnect wiring structure of the second semiconductor and forming through-silicon vias (TSVs) in accordance with an embodiment of the present invention.

FIG. 5 is a cross-sectional view of semiconductor structure 500 after bonding the interconnect wiring 31 above device 11A to interconnect wiring 32 above device 11B in accordance with an embodiment of the present invention. As depicted, FIG. 5 includes the elements of FIG. 1 and FIG. 2 where metal layer 25 depicted in interconnect wiring 31 in FIG. 1 is joined to metal layer 25 in interconnect wiring 32 above device 11B in FIG. 2. FIG. 5 depicts semiconductor structure 500 after semiconductor structure 100 of FIG. 1 is bonded to semiconductor structure 200 of FIG. 2 by interconnect wiring 31 and interconnect wiring 32. As depicted in FIG. 5, two of TSV 30 extend through substrate 2B. TSV 30 extends from a top surface of semiconductor structure 200 to a bottom surface of semiconductor structure 200. Any number of TSV 30 may be present in other embodiments of the present invention.

In various embodiments, the bonding of exposed interconnect pads in metal layer 25 on the top surface of interconnect wiring 31 to the exposed interconnect pads on the top surface of interconnect wiring 32 occurs using known copper-to-copper bonding or copper hybrid bonding. For example, the copper-to-copper bonding of the exposed interconnect pads on the top surface of interconnect wiring 31 (i.e., in metal layer 25 of FIG. 1) to the exposed interconnect pads on the top surface of interconnect wiring 32 can occur using thermal compression bonding (TCB).

TSV 30 can be formed with any known through silicon via processes. For example, TSV 30 may be formed with a deep silicon etch in a via last process, formed after bonding the interconnect wiring 31 above device 11A to interconnect wiring 32 above device 11B in accordance with an embodiment of the present invention. TSV 30 may include a via isolation layer and may be filled with a conductive material such as copper, tantalum, tungsten, or other conductive material using known via metal deposition processes such as but not limited to PVD, ALD. or a wet chemical plating process. As depicted, TSV 30 contact metal layer 25 in interconnect wiring 32 and extend to the bottom surface of semiconductor structure 500.

Figure 6:
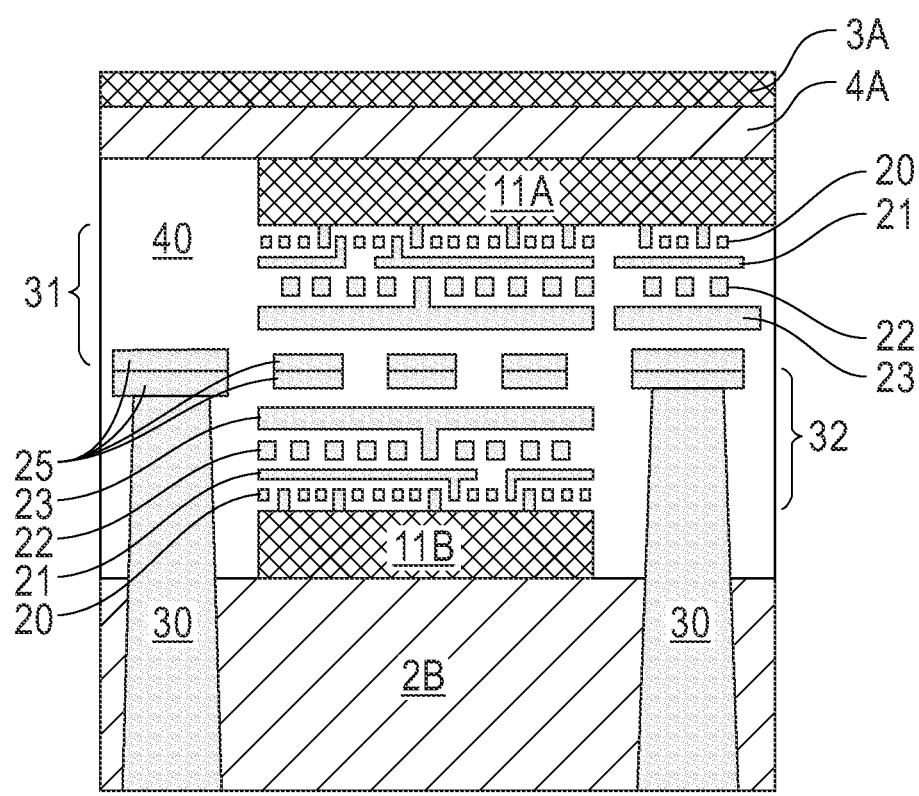
FIG. 6 is a cross-sectional view of the semiconductor structure after flipping the bonded semiconductor structure and removing the semiconductor substrate from the top surface of the first semiconductor device in accordance with an embodiment of the present invention.

FIG. 6 is a cross-sectional view of semiconductor structure 600 after flipping the bonded wafers and removing substrate 2A from the top surface of device 11A after flipping in accordance with an embodiment of the present invention. As depicted, FIG. 6 includes the elements of FIG. 5 without substrate 2A on etch stop 3A above device 11A. In FIG. 6, the bonded wafers are flipped so that the top surface of the bonded wafers have substrate 2A on etch stop 3A above device 11A as the exposed on the top surface the semiconductor structure of FIG. 6. In various embodiments, substrate 2A is removed by backside wafer thinning.

As depicted, substrate 2A above etch stop 3A above device 11A is removed. For example, using known silicon grind processes for backside wafer thinning which can be followed by CMP to remove substrate 2A above etch stop 3A. In some cases, a wet etch process may be used to remove any remaining portions of the layer of substrate 2A on the top surface of the bonded wafers after wafer backside grind and/or CMP. The silicon grind process removing substrate 2A above device 11A ends at each stop 3A. After the removal of substrate 2A, the top surface of the bonded wafers, as depicted in FIG. 6, is etch stop 3A.

Figure 7:
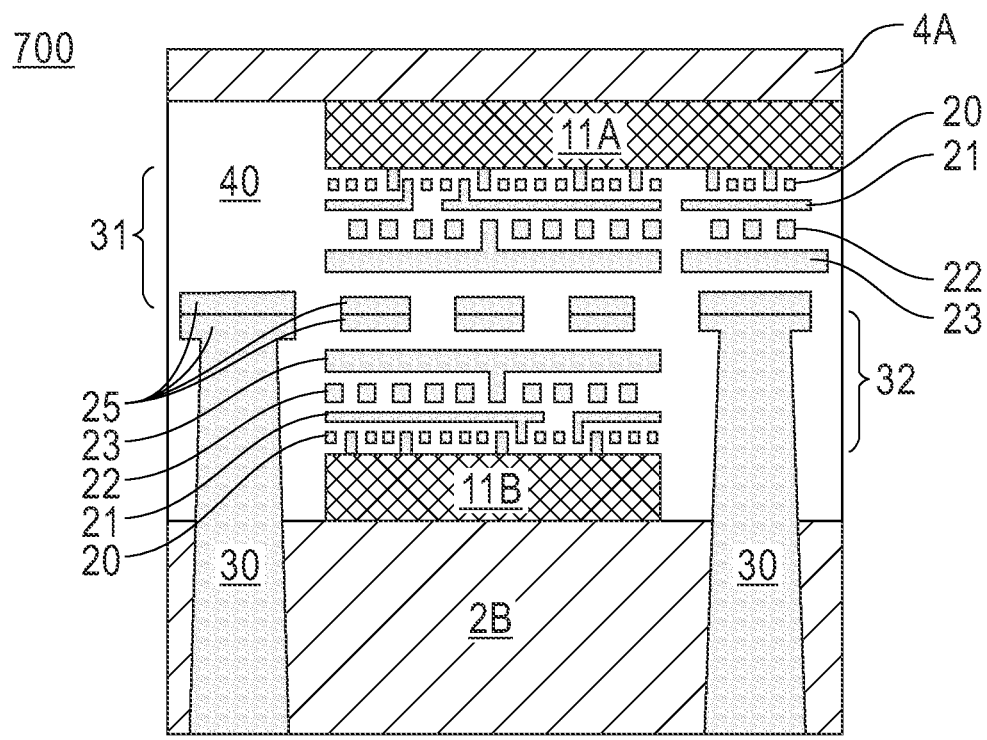
FIG. 7 is a cross-sectional view of the semiconductor structure after removing an etch stop layer from the top surface of the first semiconductor device in accordance with an embodiment of the present invention.

FIG. 7 is a cross-sectional view of semiconductor structure 700 after removing etch stop 3A in accordance with an embodiment of the present invention. As depicted, FIG. 7 includes the elements of FIG. 6 without etch stop 3A. In FIG. 7, after the removal of etch stop 3A, semiconductor 4A is now the top surface of the semiconductor structure of FIG. 7

For example, etch stop 3A above semiconductor 4A and device 11A can be removed using wet etch processes. Depending on the material used for etch stop 3A, various known wet etch chemistries may be used to remove etch stop 3A. For example, a hydrochloric acid can be for the removal of an SiGe etch stop or conventional wet etchant for BOX removal in SOI wafers may be used. After removing etch stop 3A, semiconductor 4A remains over device 11A and ILD 40.

Figure 8:
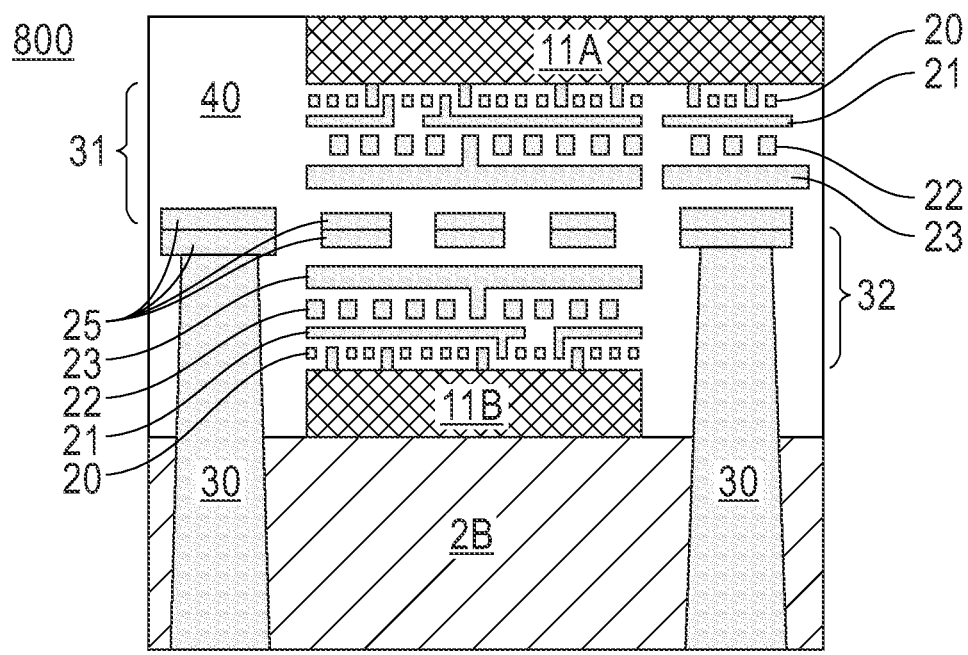
FIG. 8 is a cross-sectional view of the semiconductor structure after removing an exposed layer of semiconductor material on the first semiconductor device in accordance with an embodiment of the present invention.

FIG. 8 is a cross-sectional view of semiconductor structure 800 after removing semiconductor 4A over device 11A and ILD 40 in accordance with an embodiment of the present invention. As depicted, FIG. 8 includes the elements of FIG. 7 without the exposed top layer of semiconductor 4A.

In various embodiments, a wet etchant for silicon can remove semiconductor 4A. In other embodiments, a wet or dry etch process is used to remove semiconductor 4A (e.g., a wet etchant for another semiconductor material for semiconductor 4A or a dry etch process may be performed). In some cases, a combination of etch processes, such as a wet chemical etch followed by a dry etching process may be utilized to remove semiconductor 4A. As depicted in FIG. 8, after removing the thin layer of semiconductor 4A, the top surface of device 11A is exposed and a portion of the top surface of ILD 40 is also exposed.

Figure 9:
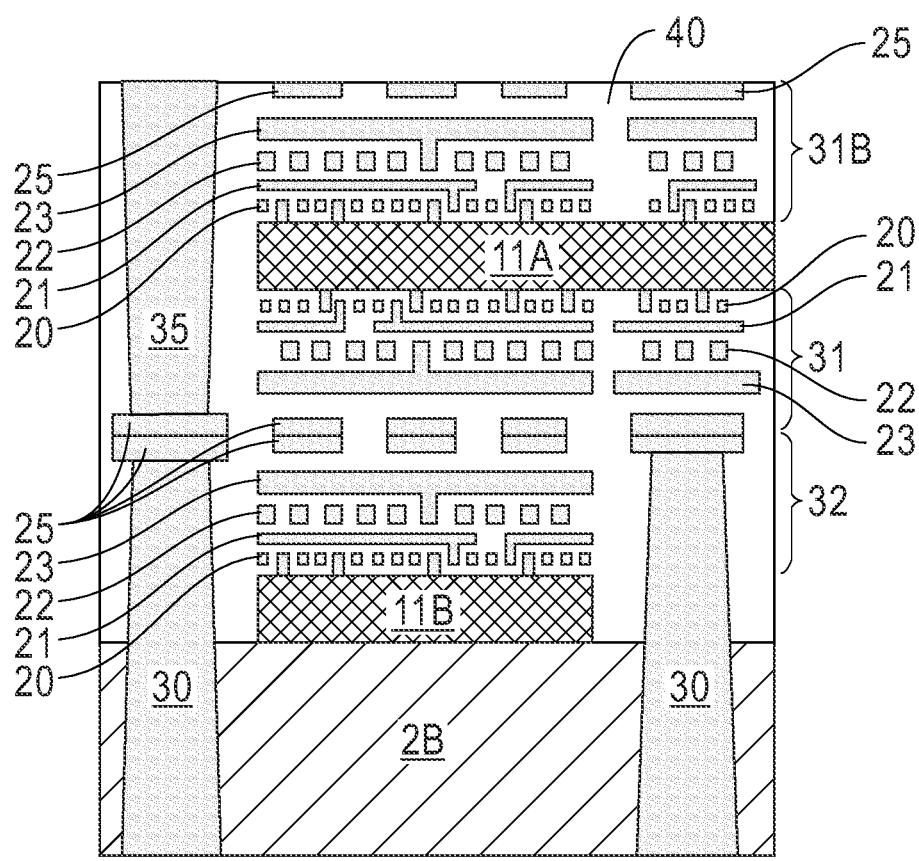
FIG. 9 is a cross-sectional view of the semiconductor structure after forming a backside interconnect wiring structure on the top surface of the first semiconductor device in accordance with an embodiment of the present invention.

FIG. 9 is a cross-sectional view of semiconductor structure 900 after forming interconnect wiring 31B on device 11A and TSV 35 in ILD 40 in accordance with an embodiment of the present invention. As depicted, FIG. 9 includes the elements of FIG. 8 and interconnect wiring 31B and TSV 35. As depicted, TSV 35 is formed from the exposed top surface of semiconductor structure of FIG. 8 extending down to a top of TSV 30. In FIG. 9, semiconductor structure 900 from bottom to top includes substrate 2B under device 11B with TSV 30, interconnect wiring 32 above device 11B, interconnect wiring 31 under device 11A, device 11A, interconnect wiring 31B on the backside of device 11A (i.e., depicted on top of device 11A in FIG. 9) and TSV 35 formed from the top of the interconnect wiring 31B to the top surface of the interconnect wiring 32. As depicted, TSV 35 connects to TSV 30 under the joined interconnect wiring pads on the top surface of interconnect wiring 32 and interconnect wiring 31.

Interconnect wiring 31B can be formed using known backside PDN process. A contact pitch of the interconnect wiring on the bottom surface of interconnect wiring 31B (e.g., connecting to device 11B) can be less than 100 nm. Interconnect wiring 31B can be formed using previously discussed lithography processes (e.g., EUV, DUV, immersion lithography, etc.).

In various embodiments, interconnect wiring 31B is formed on what was the bottom surface of device 11A in FIG. 1. While interconnect wiring 31B is formed over device 11A in FIG. 9, interconnect wiring 31B is formed on the original backside of device 11A as depicted in FIG. 1. Interconnect wiring 31B can be considered a backside wiring interconnect structure.

After forming interconnect wiring 31B, device 11A has a conventional or frontside BEOL wiring structure of interconnect wiring 31 that is under device 11A in FIG. 9 and interconnect wiring 31B can be formed on a backside of device 11A that was flipped over and bonded device 11A. In this way, using conventional BEOL processes, frontside interconnect wiring can be formed on the wafer frontside of device 11A (i.e., on a bottom surface of device 11A as depicted in FIG. 1). Interconnect wiring 31B can be a wafer backside power delivery network process (BSPDN) that is formed by BEOL on the wafer backside of device 11A (i.e., on a top surface of device 11A as depicted in FIG. 1). Additionally, interconnect wiring 31 under device 11A is joined (e.g., by copper-to-copper bonding) with interconnect wiring 32 that is over device 11B. As depicted, semiconductor structure 900 includes substrate 2B with at least device 11B covered by interconnect wiring 32 that is joined to interconnect wiring 31 under device 11A and where device 11A has a second interconnect wiring structure, i.e., interconnect wiring 31B formed above device 11A in FIG. 9. In this way, semiconductor structure 900 can be one example of heterogeneous integration.

Figure 10:
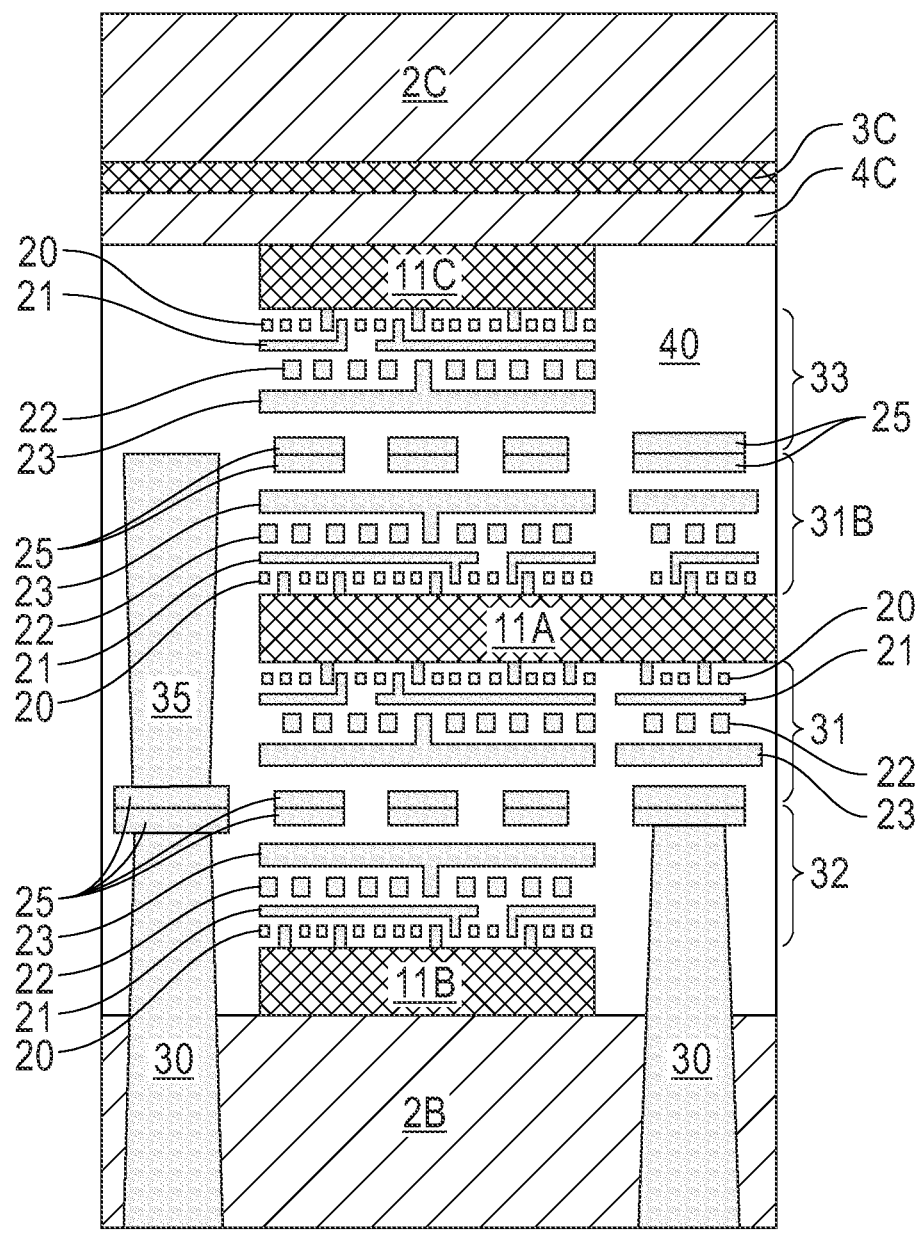
FIG. 10 is a cross-sectional view of the semiconductor structure after bonding the backside interconnect wiring structure of the first semiconductor device to the interconnect wiring structure on the third semiconductor device in accordance with an embodiment of the present invention.

FIG. 10 is a cross-sectional view of semiconductor structure 1000 after bonding interconnect wiring 31B to interconnect wiring 33 on device 11C in accordance with an embodiment of the present invention. As depicted, FIG. 10 includes the elements of FIG. 9 and device 11C, interconnect wiring 33, semiconductor 4C, etch stop 3C, and substrate 2C. In FIG. 10, interconnect wiring 33 of device 11C is bonded to interconnect wiring 31B of device 11A.

Using one of the previously discussed wafer bonding processes (e.g., copper-to-copper, hybrid copper bonding, or another suitable wafer bonding method), the interconnect pads of interconnect wiring 33 on device 11C can be joined to the interconnect pads of interconnect wiring 31B.

Figure 11:
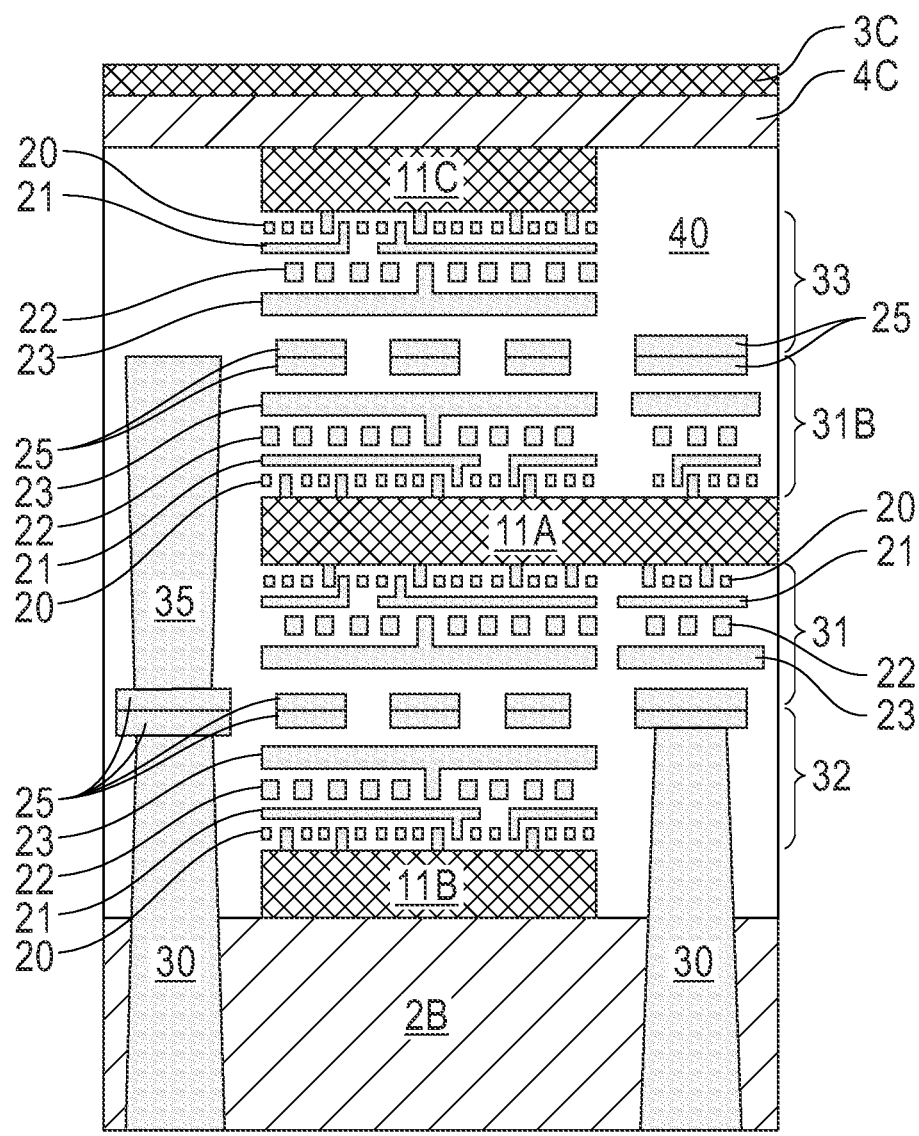
FIG. 11 is a cross-sectional view of a semiconductor structure after removing the semiconductor substrate from the top surface of the third semiconductor device in accordance with an embodiment of the present invention.

FIG. 11 is a cross-sectional view of semiconductor structure 1100 after removing substrate 2C in accordance with an embodiment of the present invention. As depicted, FIG. 11 includes the elements of FIG. 10 without substrate 2C. Using previously discussed backside wafer thinning processes, substrate 2C is removed from the top surface of semiconductor structure 1100. After removing substrate 2C, the exposed top surface of semiconductor structure 1100 is etch stop 3C.

Figure 12:
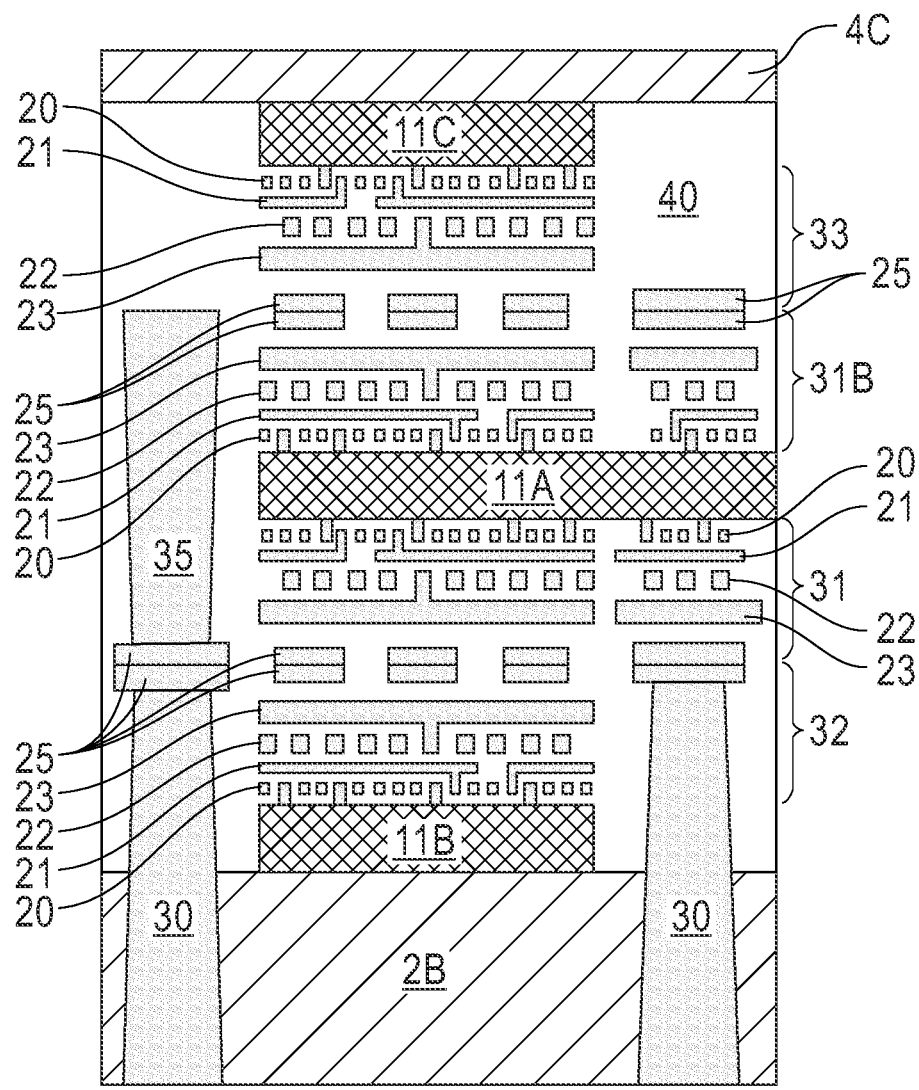
FIG. 12 is a cross-sectional view of the semiconductor structure after removing the etch stop layer from the top surface of the third semiconductor device in accordance with an embodiment of the present invention.

FIG. 12 is a cross-sectional view of semiconductor structure 1200 after removing etch stop 3C in accordance with an embodiment of the present invention. As depicted, FIG. 12 includes the elements of FIG. 11 without etch stop 3C. After removing etch stop 3C using known processes as previously discussed (e.g., wet etching processes), semiconductor 4C forms the top surface of the semiconductor structure of FIG. 12.

Figure 13:
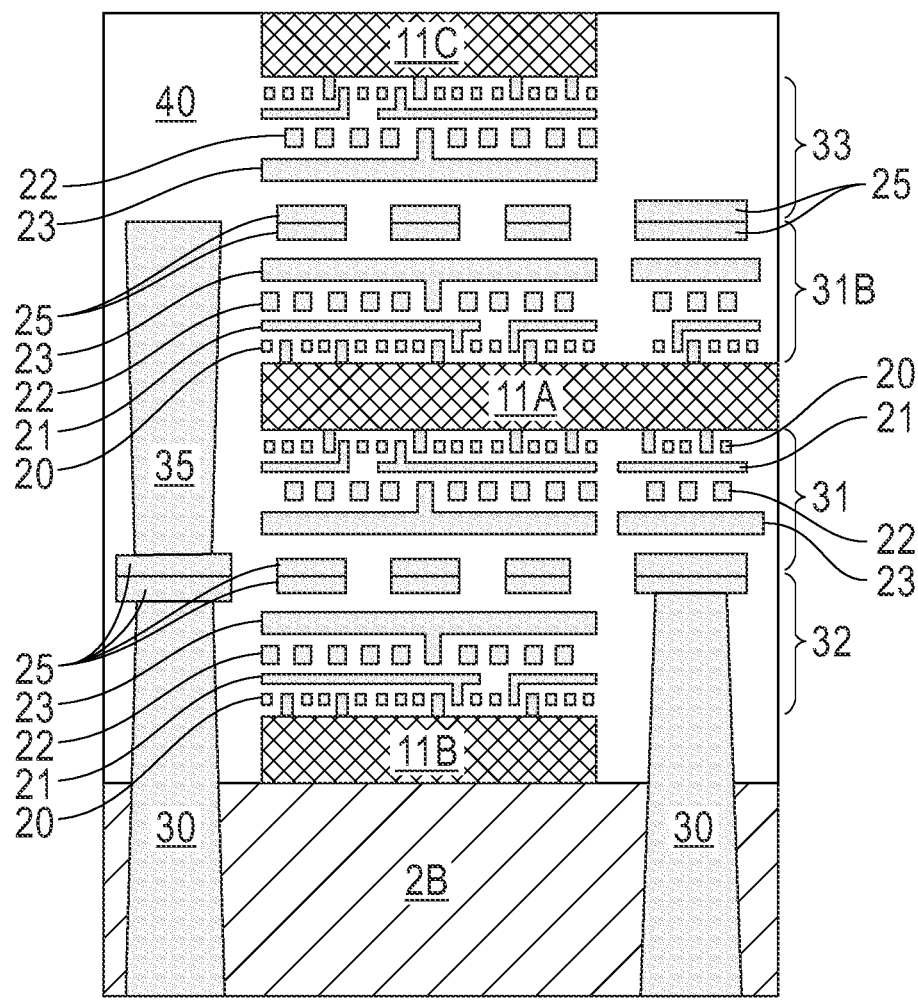
FIG. 13 is a cross-sectional view of a semiconductor structure after removing the exposed layer of semiconductor material on the third semiconductor device in accordance with an embodiment of the present invention.

FIG. 13 is a cross-sectional view of semiconductor structure 1300 after removing the exposed layer of semiconductor 4C in accordance with an embodiment of the present invention. As depicted, FIG. 13 includes the elements of FIG. 12 without semiconductor 4C. Using the previously discussed methods (e.g., one or more wet semiconductor etching processes), semiconductor 4C can be removed to expose the top surface of device 11C and portions of ILD 40.

Figure 14:
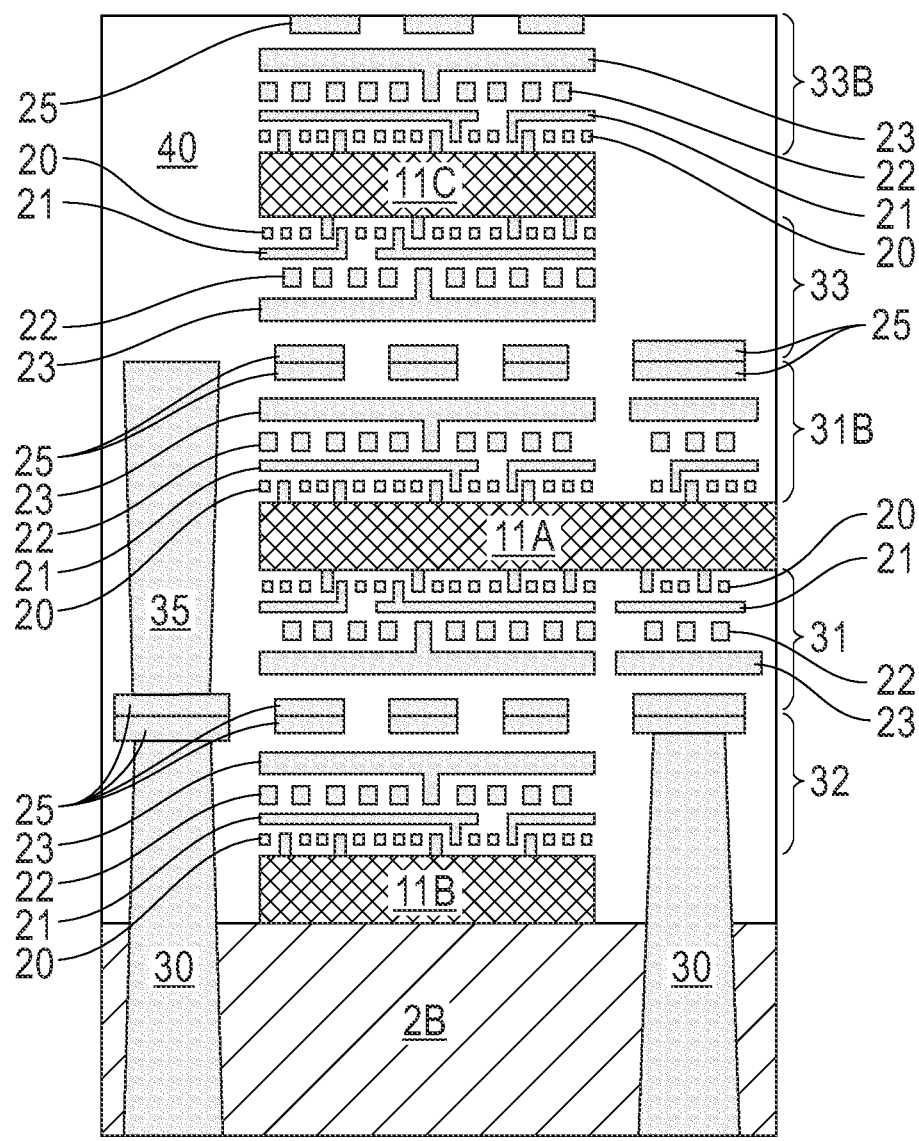
FIG. 14 is a cross-sectional view of the semiconductor structure after forming the backside interconnect wiring structure on the top surface of the third semiconductor device in accordance with an embodiment of the present invention.

FIG. 14 is a cross-sectional view of semiconductor structure 1400 after forming interconnect wiring 33B in accordance with an embodiment of the present invention. As depicted, FIG. 14 includes the elements of FIG. 13 and interconnect wiring 33B with ILD 40.

Interconnect wiring 33B can be formed with previously discussed backside power delivery network processes and lithographic processes such as EUV, DUV, and immersion lithography. A contact pitch on the bottom surface of interconnect wiring 33B can be less than 100 nm. After forming interconnect wiring 33B, device 11C has interconnect wiring on both the bottom surface and the top surface of device 11C.

As previously discussed with respect to device 11A in FIG. 9, interconnect wiring 33 was formed on the front side of device 11C as depicted in FIG. 3 and interconnect wiring 33B is formed on the original backside of device 11C. In this way, device 11C may have both a backside PDN formed with interconnect wiring 33B on the top of device 11C in FIG. 14 and a frontside PDN formed with interconnect wiring 33 under semiconductor device 11C in semiconductor structure 1400.

In various embodiments, device 11C has two interconnect wiring structures or two PDNs. The two interconnect wiring structures are interconnect wiring 33 depicted in FIG. 3 that is now under device 11C and interconnect wiring 33B that is formed, as depicted in FIG. 14, over the original backside of device 11C as depicted in FIG. 3. Semiconductor structure 1400 has interconnect wiring 33 formed using conventional BEOL processes on the bottom surface of device 11C and interconnect wiring 33B formed using wafer backside power delivery network (BSPDN) processes on the top surface of device 11C.

Figure 15:
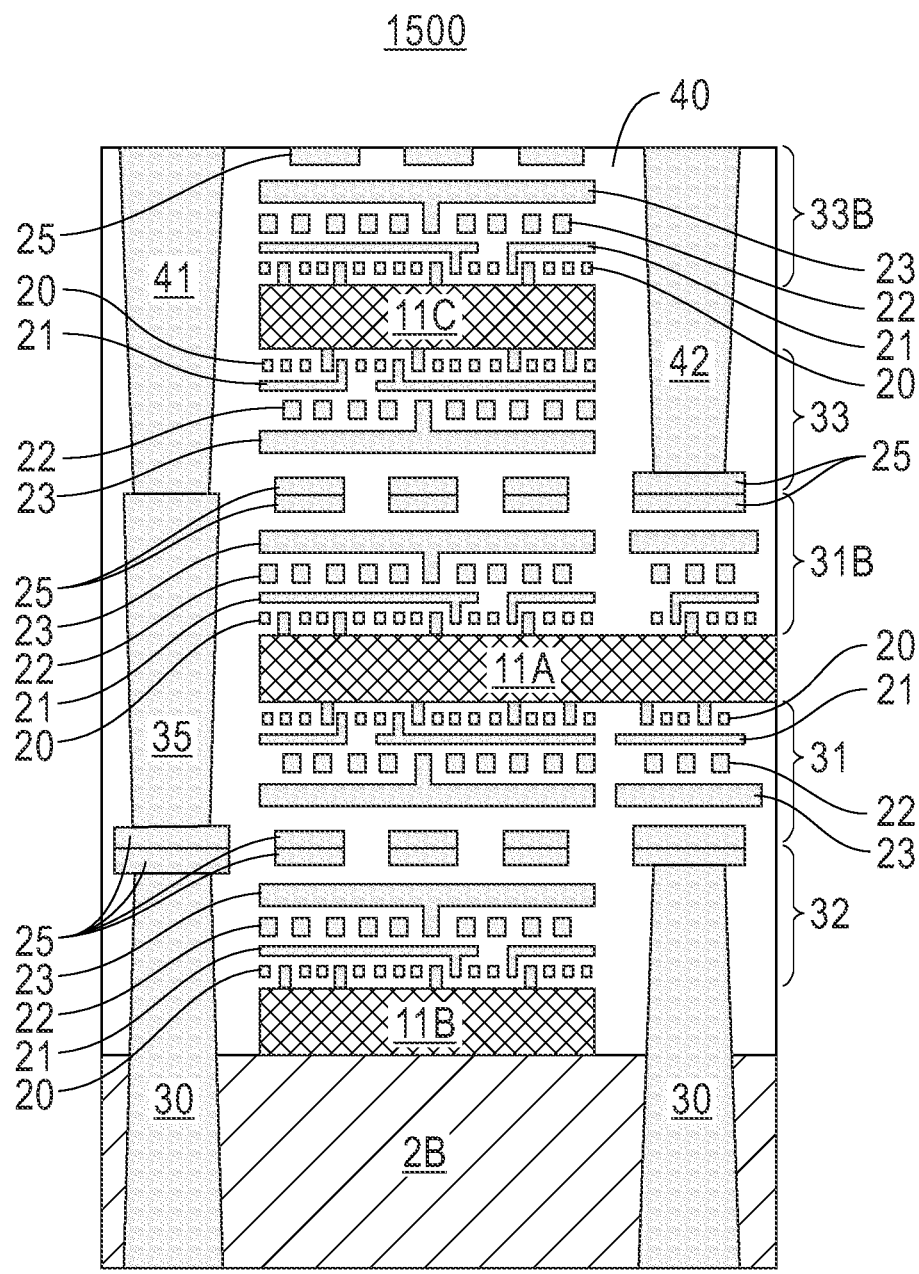
FIG. 15 is a cross-sectional view of the semiconductor structure after forming through-silicon via (TSVs) in accordance with an embodiment of the present invention.

FIG. 15 is a cross-sectional view of semiconductor structure 1500 after forming TSV 41 and TSV 42 in accordance with an embodiment of the present invention. As depicted, FIG. 15 includes the elements of FIG. 14 with TSV 41 and TSV 42. TSV 41 and TSV 42 can be formed with known TSV formation processes and with an annealing process that is followed by a CMP. In other words, after TSV 41 and TSV 42 are formed with convention TSV formation processes, an anneal of the TSV is performed that is followed by a CMP. As depicted, TSV 41 is etched through ILD 40 to contact a top surface of TSV 35 and to a bottom surface of interconnect wiring 34. TSV 42 can be formed by an etch through ILD 40 from the top of interconnect wiring 33B to the top surface of interconnect wiring 31B that is above device 11C. TSV 41 and TSV 42 can be filled with a conductive material or metal and a CMP performed.

The combination of TSV 35, TSV 41 and TSV 42 connect from both interconnect wiring 31 under device 11A and interconnect wiring 31B which can be a backside PDN. As depicted, TSV 41 connects from the top surface of interconnect wiring 33B on device 11C to the top of interconnect wiring 31A on device 11A. As depicted, both TSV 41 and TSV 42 extend to the top surface of semiconductor structure 1500.

Figure 16:
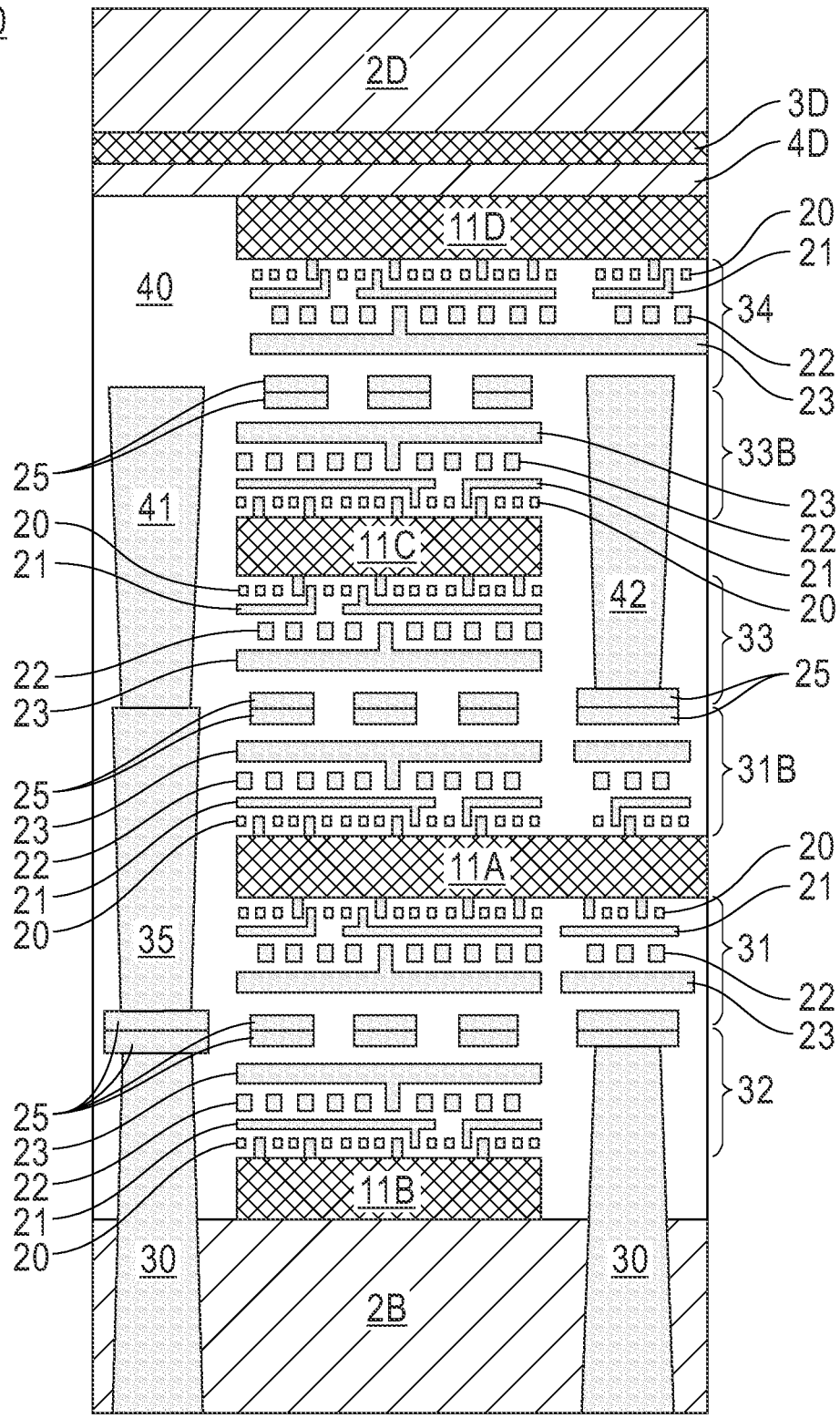
FIG. 16 is a cross-sectional view of the semiconductor structure after bonding the backside interconnect wiring structure of the third semiconductor device to the interconnect wiring of the fourth semiconductor device in accordance with an embodiment of the present invention.

FIG. 16 is a cross-sectional view of semiconductor structure 1600 after bonding interconnect wiring 34 to interconnect wiring 33B in accordance with an embodiment of the present invention. As depicted, FIG. 16 includes the elements of FIG. 17 and interconnect wiring 34, device 11D, semiconductor 4D, etch stop 3D, and substrate 2D. Interconnect wiring 34 is joined to interconnect wiring 33B using previously discussed copper-to-copper bonding or another suitable interconnect pad joining process.

Figure 17:
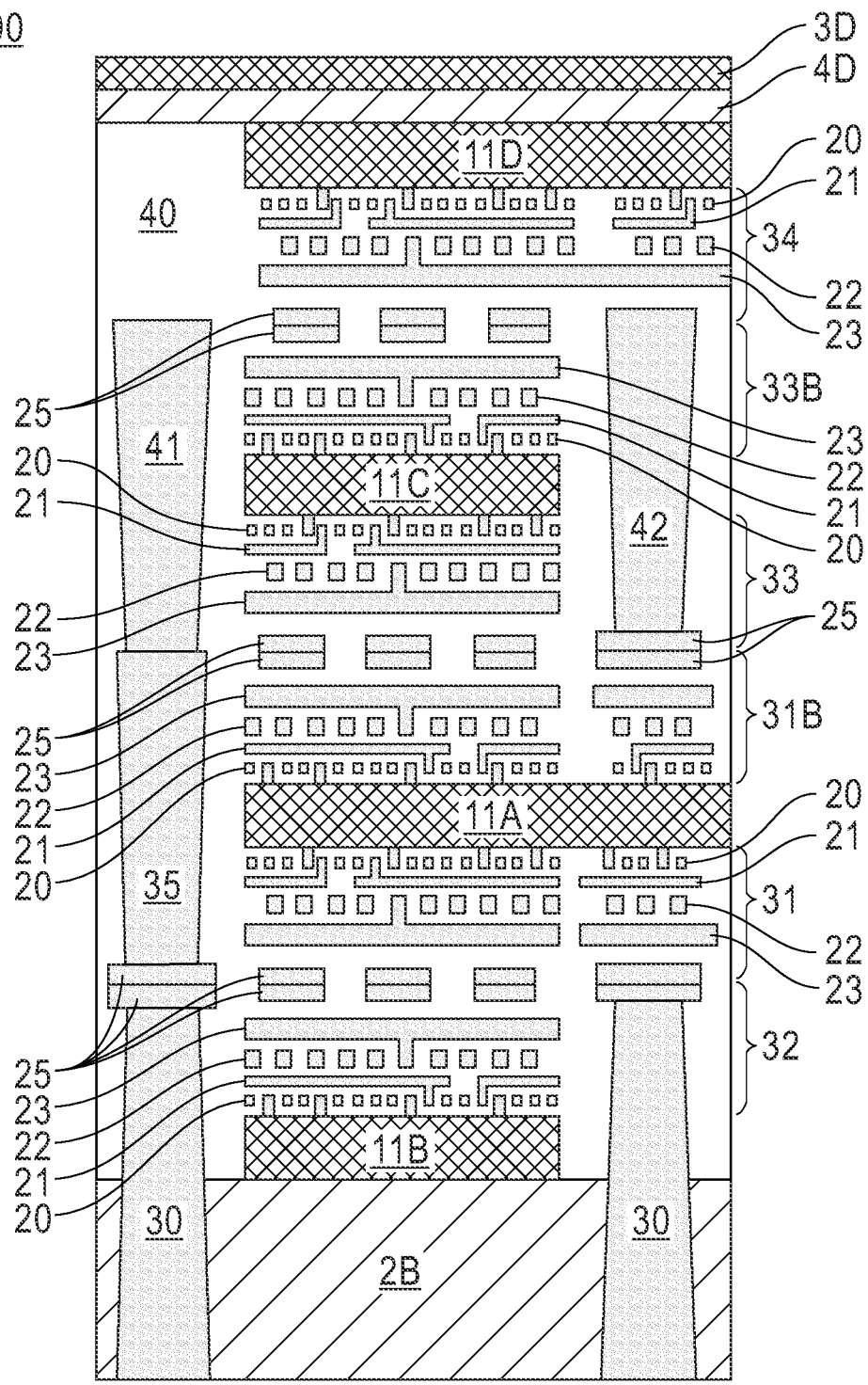
FIG. 17 is a cross-sectional view of the semiconductor structure after removing the semiconductor substrate from the top surface of the fourth semiconductor device in accordance with an embodiment of the present invention.

FIG. 17 is a cross-sectional view of semiconductor structure 1700 after removing substrate 2D in accordance with an embodiment of the present invention. As depicted, FIG. 17 includes the elements of FIG. 16 without substrate 2D which is removed using the previously discussed methods (e.g., backside wafer thinning using silicon grinding, CMP and an optional wet etching process).

Figure 18:
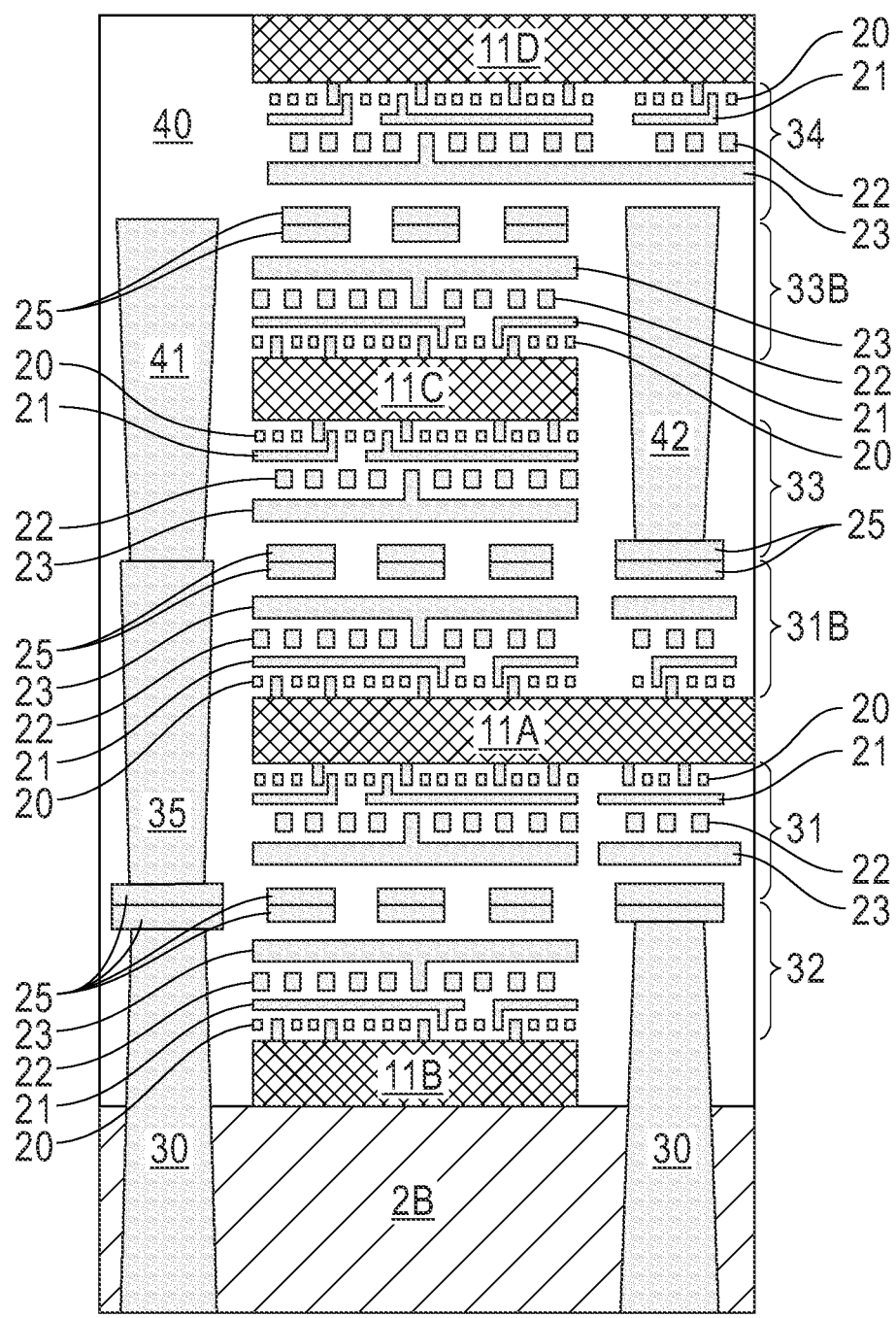
FIG. 18 is a cross-sectional view of the semiconductor structure after removing the etch stop layer and the exposed layer of semiconductor material on top of the fourth semiconductor device in accordance with an embodiment of the present invention.

FIG. 18 is a cross-sectional view of semiconductor structure 1800 after removing both etch stop 3D and semiconductor 4D in accordance with an embodiment of the present invention. As depicted, FIG. 18 includes the elements of FIG. 17 with etch stop 3D and semiconductor 4D. Etch stop 3D and semiconductor 4D are removed using the previously discussed processes (e.g., wet etching process).

Figure 19:
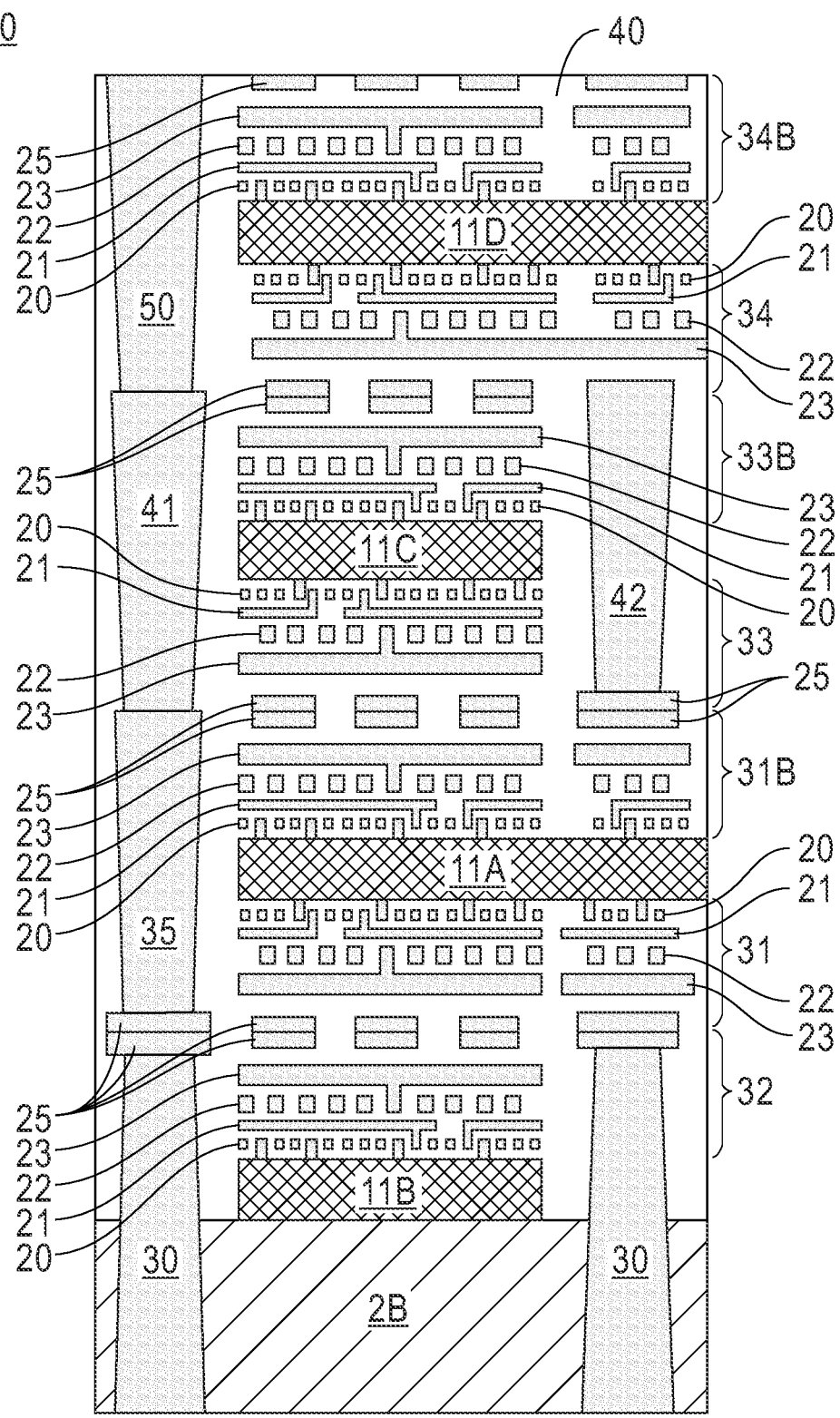
FIG. 19 is a cross-sectional view of the semiconductor structure after forming the backside interconnect wiring structure on the top surface of the fourth semiconductor device and forming TSVs in accordance with an embodiment of the present invention.

FIG. 19 is a cross-sectional view of semiconductor structure 1900 after forming interconnect wiring 34B and TSV 50 in accordance with an embodiment of the present invention. As depicted, FIG. 19 includes interconnect wiring 34B, TSV 50, device 11D, interconnect wiring 34, interconnect wiring 33B, interconnect wiring 33, TSV 41, TSV 42, device 11C, interconnect wiring 31B, TSV 35, device 11A, interconnect wiring 31, interconnect wiring 32, TSVs 30, device 11B, ILD 40, and substrate 2B. In various embodiments, a pitch of the interconnect wiring on the bottom surface of interconnect wiring 34B connecting to device 11B is less than 100 nm but is not limited to this size. As previously discussed with reference to TSV 41 and TSV 42, the formation of TSV 50 includes conventional TSV etch, isolation layer deposition in the TSV via, and via fill processes. Additionally, TSV 50 formation like TSV 30, TSV 40, and TSV 41 includes a TSV annealing process that is followed by a CMP. As depicted, TSV 50 connects a top surface of interconnect wiring 33B to a top surface of interconnect wiring 34B on device 11D. As depicted in FIG. 19, the combination of TSV 30, TSV 40, and TSV 50 connect the bottom surface of substrate 2 to the top surface of interconnect wiring 34B.

Semiconductor structure 1900 is another example of heterogeneous integration that includes substrate 2B with device 11B and devices 11A, 11C, and 11D stacked over device 11B, where each of device 11B, 11A, 11C, and 11D are joined by two interconnect wiring structures. The two joined interconnect wiring structure include one interconnect structure above each device and one interconnect wiring structure is under each of device 11A, 11C, and 11D.

In FIG. 19, four semiconductor devices (device 11A, 11B, 11C, and 11D) are stacked above a single semiconductor substrate or wafer (i.e., substrate 2B) and are connected using multiple TSVs and bonded interconnect wiring structures. Three of the semiconductor devices (i.e., device 11A, device 11C, and device 11D) include both backside PDN and top side PDN, or in other words, these three devices have interconnect wiring formed on both the bottom and the top surfaces of the devices. The fourth device (i.e., device 11B) resides above a semiconductor substrate (i.e., substrate 2B) and is connected to the other three devices by copper-to-copper bonding of the interconnect wiring (i.e., interconnect wiring 32 to interconnect wiring 31, interconnect wiring 31B to interconnect wiring 33, and interconnect wiring 33B to interconnect wiring 34). In other examples, another suitable interconnect pad to pad bonding method may be used (e.g., hybrid copper bonding, etc.).

As known to one skilled in the art, the methods and processes discussed to form the semiconductor structure of FIG. 19 may be applied to bond more than four semiconductor devices together. Additionally, as known to one skilled in the art, the methods and processes disclosed herein may be used to form less than four stacked semiconductor devices. For example, any of the stacked semiconductor devices depicted in the semiconductor structures of FIGS. 5-19 could be used as a semiconductor chip using heterogeneous integration.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections and buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:
1. A semiconductor structure comprising:
a first semiconductor device on a substrate;
a first interconnect wiring structure over the first semiconductor device;

a second interconnect wiring structure under a second semiconductor device, wherein the second interconnect wiring structure physically contacts the first interconnect wiring structure;

a third interconnect wiring structure (i) on the second semiconductor device and (ii) electrically contacting the second semiconductor device through a top surface of the second semiconductor device; and a first through-silicon via from a bottom surface of the substrate to a top surface of the first interconnect wiring structure, wherein the first through-silicon via is tapered such that a width of a bottom surface of the first through-silicon via is greater than a width of a top surface of the first through-silicon via.

2. The semiconductor structure of claim 1, wherein the first semiconductor device and the second semiconductor device are each selected from the group consisting of: a memory device and a logic device.

3. The semiconductor structure of claim 1, wherein the first interconnect wiring structure, the second interconnect wiring structure, and the third interconnect wiring structure each has a contact pitch on a bottom surface that is less than one hundred nanometers.

4. The semiconductor structure of claim 3, wherein:
the second interconnect wiring structure is a frontside interconnect wiring structure for the second semiconductor device; and
the third interconnect wiring structure is a backside interconnect wiring structure, for the second semiconductor device, providing a backside power delivery network.

5. The semiconductor structure of claim 1, further comprising:
a second through-silicon via connecting from the first through-silicon via to a top surface of the third interconnect wiring structure, wherein the first through-silicon via and the second through-silicon via are centered along a single axis.

6. A semiconductor structure comprising:
a first semiconductor device on a substrate;
a first interconnect wiring structure over the first semiconductor device;
a second interconnect wiring structure under a second semiconductor device, wherein the second interconnect wiring structure contacts the first interconnect wiring structure;
a third interconnect wiring structure on the second semiconductor device, wherein:
the third interconnect wiring structure contacts a fourth interconnect wiring structure; and
the fourth interconnect wiring structure is under a third semiconductor device;
a fifth interconnect wiring structure on the third semiconductor device;
a first through-silicon via from a bottom surface of the substrate to a top surface of the first interconnect wiring structure, wherein the first through-silicon via is tapered such that a width of a bottom surface of the first through-silicon via is greater than a width of a top surface of the first through-silicon via; and
a second through-silicon via connecting from the first through-silicon via to a top surface of the third interconnect wiring structure, wherein the second through-silicon via is tapered opposite that of the first through-silicon via.

7. The semiconductor structure of claim 6, wherein the first through-silicon via and the second through-silicon via are centered along a single axis, further comprising:
a third through-silicon via connecting from a top surface of the third interconnect wiring structure to a top surface of the fifth interconnect wiring structure.

8. The semiconductor structure of claim 6, wherein the first semiconductor device, the second semiconductor device, and the third semiconductor device are each selected from a group consisting of: a logic device and a memory device.

9. The semiconductor structure of claim 6, wherein the third interconnect wiring structure has a contact pitch of less than one hundred nanometers with the second semiconductor device.

10. The semiconductor structure of claim 6, wherein the second semiconductor device and the third semiconductor device each have both a frontside interconnect wiring structure and a backside interconnect wiring structure.

11. The semiconductor structure of claim 6, further comprising:
a sixth interconnect wiring structure under a fourth semiconductor device connected to the fifth interconnect wiring structure; and
a seventh interconnect wiring structure on the fourth semiconductor device, wherein at least a fourth through-silicon via connects from a top surface of the seventh interconnect wiring structure to a top surface of the sixth interconnect wiring structure.

12. The semiconductor structure of claim 6, wherein the second interconnect wiring structure under the second semiconductor device joined to the first interconnect wiring structure is joined by a plurality of wiring pads on a top surface of the first interconnect wiring structure bonded by thermal compression bonding to the plurality of wiring pads on a top surface of the second interconnect wiring structure.

13. The semiconductor structure of claim 6, further comprising:
a first through-silicon via from a bottom surface of the substrate to a top surface of the first interconnect wiring structure;
a second through-silicon via connecting from the first through-silicon via to a top surface of the third interconnect wiring structure; and
a third through-silicon via connecting from a top surface of the third interconnect wiring structure to a top surface of the fifth interconnect wiring structure, wherein the second semiconductor device and the third semiconductor device each have a backside interconnect wiring structure and a frontside interconnect wiring structure.

14. The semiconductor structure of claim 13, wherein the first through-silicon via connects to the second through-silicon via and the third through-silicon via connects to the second through-silicon via.

15. The semiconductor structure of claim 14, wherein:
the first through-silicon via connects to the second through-silicon via and the third through-silicon via connects to the second through-silicon via, and
the first through-silicon via connects from a bottom surface of the substrate through the second through-silicon via and through the third through-silicon via to a top surface of the fifth interconnect wiring structure.

* * * * *